(12) United States Patent
Ellis et al.

(10) Patent No.: US 6,561,725 B1
(45) Date of Patent: May 13, 2003

(54) SYSTEM AND METHOD FOR COUPLING MICROCOMPONENTS UTILIZING A PRESSURE FITTING RECEPTACLE

(75) Inventors: Matthew D. Ellis, Allen, TX (US); George D. Skidmore, Plano, TX (US)

(73) Assignee: Zyvex Corporation, Richardson, TX (US)

(*) Notice: Subject to any disclaimer, the term of this patent is extended or adjusted under 35 U.S.C. 154(b) by 211 days.

(21) Appl. No.: 09/643,011

(22) Filed: Aug. 21, 2000

(51) Int. Cl.⁷ .......................... H01R 16/627; A41F 1/00

(52) U.S. Cl. .......................... 403/326; 403/329; 24/625; 24/453

(58) Field of Search ................................ 403/326, 329; 24/453, 297, 625; 439/352, 357, 358, 328

(56) References Cited

U.S. PATENT DOCUMENTS

| | | | |
|---|---|---|---|
| 3,439,416 A | 4/1969 | Yando | |
| 4,141,138 A | 2/1979 | Quick | |
| 4,740,410 A | 4/1988 | Muller | |
| 5,113,117 A | * 5/1992 | Brooks et al. | 310/328 |
| 5,645,684 A | 7/1997 | Keller | |
| 5,657,516 A | 8/1997 | Berg et al. | |
| 5,660,680 A | 8/1997 | Keller | |
| 5,806,152 A | 9/1998 | Saitou | |
| 5,818,748 A | 10/1998 | Bertin | |
| 6,193,541 B1 | * 2/2001 | Lee | 439/358 X |
| 6,257,925 B1 | * 7/2001 | Jones | 439/357 X |

FOREIGN PATENT DOCUMENTS

| EP | 0 497 620 A | 8/1992 |
|---|---|---|
| JP | 57 161819 A | 10/1982 |

OTHER PUBLICATIONS

A New Pick Up & Release Method By Heating For Micromanipulation, by Fumihito Arai and Toshio Fukuda, Jan. 1997.

Advanced Parts Orientation System Has Wide Application, by H. Hitakawa, Aug. 1988.

Design, Fabrication, and Characterization of Single Crystal Silicon Latching Snap Fasteners for Micro Assembly, by Rama.

(List continued on next page.)

Primary Examiner—Lynne H. Browne
Assistant Examiner—John Cottingham
(74) Attorney, Agent, or Firm—Fulbright & Jaworski L.L.P.

(57) ABSTRACT

A system and method which provide a general-purpose pressure-fitting receptacle (or "clamp") suitable for coupling microcomponents are disclosed. A pressure-fitting receptacle is disclosed that is suitable for performing general assembly, including out-of-plane, 3-D assembly of microcomponents, wherein such microcomponents may be securely coupled together. That is, a pressure-fitting receptacle is disclosed which enables microcomponents to be coupled in a manner that constrains undesirable movement of the coupled components relative to each other. Preferably, such a receptacle may be pressure fit with a mating component (or a portion thereof) in a manner that constrains translational and rotational degrees of freedom of the mating component relative to the receptacle. A preferred embodiment provides a "preloaded" receptacle that may be utilized to perform general assembly of microcomponents. An alternative embodiment provides a non-preloaded receptacle suitable for performing general assembly of microcomponents. Still a further alternative embodiment provides an "expansion" receptacle that is suitable for performing general assembly of microcomponents. Such pressure-fitting receptacles may be implemented as an integrated part of a microcomponent, or they may be implemented as separate, stand-alone receptacles.

56 Claims, 5 Drawing Sheets

OTHER PUBLICATIONS

Fluidic Self–Assembly of Microstructures and its Application to the Integration of GaAs on Si, by Hsi–Jen J. Yeh and John S.

Hexsil Tweezers for Teleoperated Microassembly, by C. G. Keller and R. T. Howe, Jan. 1997.

Microassembly Technologies for MEMS, by Michael B. Cohn et al.

Microfabricated High Aspect Ratio Silicon Flexures, by Chris Keller, 1998.

Self–Assembling Electrical Networks: An Application of Micromachining Technology, by Michael B. Cohn et al., May 1991.

Surface–Micromachined Components for Articulated Microrobots, by Richard Yeh, et al., Mar. 1996.

Survey of Sticking Effects for Micro Parts Handling, by Ronald S. Fearing, Apr. 1995.

Search Report in PCT/US01/24173 dated May 17, 2002.

* cited by examiner

SYSTEM AND METHOD FOR COUPLING MICROCOMPONENTS UTILIZING A PRESSURE FITTING RECEPTACLE

RELATED APPLICATIONS

This application is related to co-pending and commonly assigned U.S. patent application Ser. No. 09/569,330 entitled "METHOD AND SYSTEM FOR SELF-REPLICATING MANUFACTURING STATIONS," filed May 11, 2000; 09/570,170 entitled "SYSTEM AND METHOD FOR COUPLING MICROCOMPONENTS," filed May 11, 2000; U.S. Pat. No. 6,398,280 entitled "GRIPPER AND COMPLEMENTARY HANDLE FOR USE WITH MICROCOMPONENTS," issued Jun. 4, 2002; and 09/569,328 entitled "RIBBON CABLE AND ELECTRICAL CONNECTOR FOR USE WITH MICROCOMPONENTS," filed May 11, 2000, the disclosures of which are hereby incorporated herein by reference.

TECHNICAL FIELD

The present invention relates in general to mechanisms for coupling two components, and in specific to pressure fitting receptacles for coupling microcomponents.

BACKGROUND

Extraordinary advances are being made in micromechanical devices and microelectronic devices. Further, advances are being made in MicroElectroMechanical ("MEMs") devices, which comprise integrated micromechanical and microelectronic devices. The terms "microcomponent" and "microdevice" will be used herein generically to encompass microelectronic components, micromechanical components, as well as MEMs components. A need exists in the prior art for a mechanism for coupling microcomponents. For example, a need exists for some type of mechanical connector that provides either a permanent mechanical coupling or a temporary coupling between two or more microcomponents.

Generally, microcomponent devices are devices having a size below one millimeter by one millimeter. Although, microcomponents as large as one centimeter by one centimeter have been provided in the prior art. Moreover, microcomponents may be smaller than one millimeter by one millimeter in size. Furthermore, techniques for fabricating microcomponents typically produce such microcomponents having a minimum feature size of approximately one micron. Although, such microcomponents may be implemented with a minimum feature size of greater or less than one micron.

Various types of coupling mechanisms are well known for large scale assembly. For example, mechanisms such as screws, bolts, rivets, snap connectors, clamps, and a variety of other types of coupling mechanisms are well known and commonly used for coupling large scale components. However, such coupling mechanisms for large scale components are very difficult to implement on the small scale necessary for coupling microcomponents. That is, many large scale coupling mechanisms are unacceptable and are not easily adaptable for coupling microcomponents.

Microcomponents, such as MEMs, are generally fabricated as two dimensional ("2-D") components. That is, microcomponents generally have a defined 2-D shape (e.g., defined X dimension and Y dimension), but the third dimension (e.g., the Z dimension) is generally set for the entire part. Limited control over the Z dimension may be achieved by using multiple layers in microcomponent designs. Although, any given layer of the microcomponent is a given thickness. Thus, a more desirable method to alter the Z dimension, is to combine microcomponent parts together.

One prior art technique commonly used for assembling microcomponents, such as MEMs, is serial microassembly, which may also be referred to as "pick and place" assembly. With serial microassembly, each device is assembled together one component at a time, in a serial fashion. For example, if a device is formed by combining two microcomponents together, a placing mechanism is used to pick up one of the two microcomponents and place it on a desired location of the other microcomponent. While such a serial microassembly technique using pick and place operations initially appears to be a simple technique, when working with microcomponents, such pick and place operations are very complex. For microassembly, the relative importance of the forces that operate is very different from that in the macro world. For example, gravity is usually negligible, while surface adhesion and electrostatic forces dominate. (See e.g., *A survey of sticking effects for micro parts handling*, by R. S. Fearing, IEEE/RSJ Int. Workshop on Intelligent Robots and Systems, 1995; *Hexsil tweezers for teleoperated microassembly*, by C. G. Keller and R.T. Howe, IEEE Micro Electro Mechanical Systems Workshop, 1997, pp. 72–77; and *Microassembly Technologies for MEMS*, by Micheal B. Cohn, Karl F. Böhringer, J. Mark Noworolski, Angad Singh, Chris G. Keller, Ken Y. Goldberg, and Roger T. Howe). Due to scaling effects, forces that are insignificant at the macro scale become dominant at the micro scale (and vice versa). For example, when parts to be handled are less than one millimeter in size, adhesive forces between a gripper (e.g., micro-tweezers) and a microcomponent can be significant compared to gravitational forces. These adhesive forces arise primarily from surface tension, van der Waals, and electrostatic attractions and can be a fundamental limitation to handling of microcomponents. While it is possible to fabricate miniature versions of conventional robot grippers in the prior art, overcoming adhesion effects for such small-scale components has been a recognized problem.

Often in attempting to place a microcomponent in a desired location, the component will "stick" or adhere to the placing mechanism due to the aforementioned surface adhesion forces present in microassembly, making it very difficult to place the component in a desired location. (See e.g., *Microfabricated High Aspect Ratio Silicon Flexures*, Chris Keller, 1998). For example, small-scale "tweezers" (or other types of "grippers") are used to perform such pick and place operations of serial microassembly, and often a microcomponent will adhere to the tweezers rather than the desired location, making placement of the microcomponent very difficult. It has been recognized in the prior art that to grip microcomponents and then attach them to the workpiece in the desired orientation, it is essential that a hierarchy of adhesive forces be established. For instance, electrostatic forces due to surface charges or ions in the ambient must be minimized. Adhesion of the micropart to the unclamped gripper surfaces (with zero applied force) should be less than the adhesion of the micropart to the substrate, to allow precise positioning of the part in the gripper.

Accordingly, unconventional approaches have been proposed for performing the pick and place operations. For example, Arai and Fukada have built manipulators with heated micro holes. See *A new pick up and release method by heating for micromanipulation*, by F. Arai and T. Fukada, IEEE Micro Electro Mechanical Systems Workshop, 1997, pp. 383–388). When the holes cool, they act as suction cups whose lower pressure holds appropriately shaped objects in place. Heating of the cavities increases the pressure and causes the objects to detach from the manipulator. Alternatively, some type of external adhesive (e.g., a type of liquid "glue") may be utilized to enable the microcomponent to be placed in a desired location. That is, because the components themselves provide no mechanism for coupling, an external adhesive may be required to overcome the adhesive force between the component and the placing mechanism (e.g., tweezers). For example, the target spot on the workpiece may have a surface coating that provides sufficiently strong adhesion to exceed that between the micropart and the unclamped gripper.

Another prior art technique commonly used for assembling microcomponents, such as MEMs, is parallel microassembly. In parallel microassembly, microcomponents of one wafer are coupled to microcomponents of another wafer simultaneously in a single step. For example, the above pick and place operations may be performed on an entire wafer, such that one wafer is picked up and placed onto another wafer, thereby coupling the microcomponents of one wafer with the microcomponents of the other wafer. Therefore, parallel assembly involves the simultaneous precise organization of an ensemble of microcomponents. This can be achieved by microstructure transfer between aligned wafers or arrays of binding sites that trap an initially random collection of parts. Binding sites can be micromachined cavities or electrostatic traps; short-range attractive forces and random agitation of the parts serve to fill the sites.

Parallel microassembly techniques may be categorized as either "deterministic" or "stochastic," depending on whether the microcomponents are initially organized. There are two general approaches to parallel microassembly in the prior art, one based on the massively parallel transfer between wafers of arrays of microcomponents (i.e., "deterministic parallel microassembly") and one utilizing various approaches to orient an initially random array of microcomponents (i.e., "stochastic parallel microassembly"). Deterministic parallel microassembly refers to direct, wafer-to-wafer transfer of microcomponents. Since the placement of the microcomponents is predetermined by their layout on the donor wafer, the challenge with such process typically lies in bonding the components to the target. A common technique for bonding the components utilizes solder bumps to achieve such bonding.

While conventional assembly techniques have been successfully adapted from the macro world, the molecular regime offers many examples of efficient assembly processes. Crystal growth, antibody-antigen recognition, and most other chemical and biological behaviors are mediated by thermal motion and interparticle forces. In contrast to the macroscopic concepts of manipulators and path planning, a molecular system may be analyzed as an ensemble of particles evolving toward a state of minimal potential energy. The lure of this thermodynamic approach is that when parts must be redistributed or reoriented, a single complex manipulator may be replaced by an array of lithographicallydefined binding sites. Such sites might consist of electrostatic traps, or simply etched wells on a substrate. Thermodynamic analysis shows the potential for massively parallel operation forming assemblies $10^6$ or more elements in seconds, with placement tolerance limited by lithographic accuracy.

Historically, stochastic assembly precedes MEMS by several decades. One of the best illustrations is the work of Yando disclosed in U.S. Pat. No. 3,439,416 entitled "Method and Apparatus for Fabricating an Array of Discrete Elements" issued in 1969, which discloses an array of magnets on which particles with magnetic coatings are placed, vibrated, and trapped so as to form a matching array. Each particle is described as a microelectronic device, such as a diode. One problem with this scheme is that the magnet arrays are composed of laminated sheets stacked perpendicularly to the place of the array, so that many laminations are needed to achieve an array of appreciable extent. A further example is the APOS parts feeder described by Hitakawa. (See *Advanced Parts Orientation System Has Wide Application*, by H. Hitakawa, Assembly Automation, 8(3), 1988). The feeder uses an array of "berths" cut into a vibrating plate. Parts are fed over the plate, and the berths are designed, like the track of the bowl feeder, to accept only parts in a given orientation. Eventually, all the berths are filled.

Various stochastic assembly "wet processes" have also been proposed. (See e.g., *Fluidic Self-assembly of Microstructures and its Application to the Integration of GaAs on Si*, by H. J. Yeh and J. S. Smith, Proceedings IEEE Micro Electro Mechanical Systems, Oiso, Japan, Jan. 25–28, 1994/ New York: IEEE, 1994, p. 279–84; and *Self-Orienting Fluidic Transport (SOFT) Assembly of Liquid Crystal Displays*, by M. A. Hadley, presentation at the Defense Manufacturing Conference, Palm Springs, Calif., Dec. 1–4, 1997). Additionally, various stochastic assembly "dry processes" have been proposed. For example, in 1991, Cohn, Kim, and Pisano described stochastic assembly using vibration and gravitational forces to assemble arrays of up to 1000 silicon chiplets. (*See Self-Assembling Electrical Networks: An Application of Micromachining Technology*, by M. Cohn, C. J. Kim, and A. P. Pisano, Transducers 91 International Conference on Solid-State Sensors and Actuators, Digest of Technical Papers, San Francisco, Jun. 24–27, 1991/New York: IEEE, 1991, p. 493).

Figure 8A:
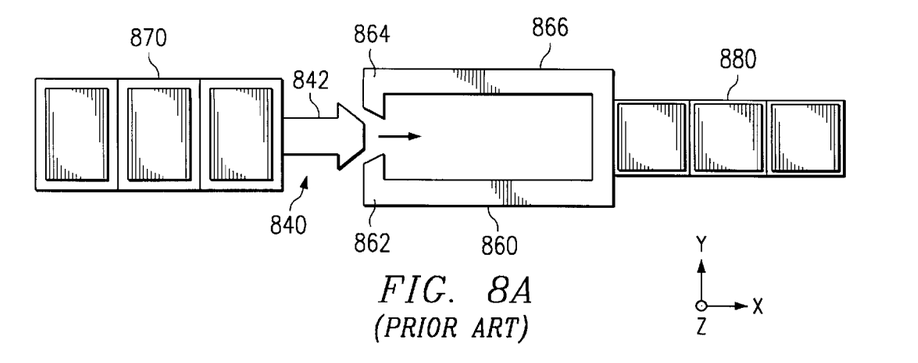
FIGS. 8A and 8B show a prior art snap connector and receptacle used for in-plane coupling of microcomponents.
Figure 8B:
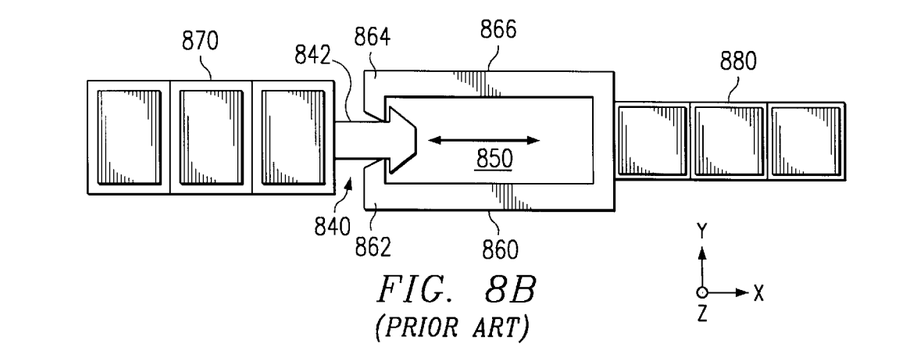

Snap connectors have been proposed in the prior art as a mechanism for coupling MEMs components (see e.g., *Design, Fabrication, and Characterization of Single Crystal Silicon Latching Snap Fasteners for Micro Assembly*, by Rama Prasad, Karl-Friedrich Böhringer, and Noel C. MacDonald, Proc. ASME Int. Mech. Eng. Congress and Exposition, 1995). A snap connector as proposed in the prior art is shown in FIGS. 8A and 8B. As shown in FIG. 8A, a snap connector 840 having an "anchor" (or "barbed end") 842 is coupled to a component 870. Furthermore, a mating component 860 coupled to a different component 880 is provided, which includes "latches" 862 and 864. The snap connector 840 of the prior art is moved linearly along the plane of the wafer (i.e., along the X axis of FIGS. 8A and 8B) to enable the component 870 to be coupled to the component 880 within the plane of the wafer. FIG. 8B illustrates such a coupling.

Thus, snap connectors have been proposed that are capable of coupling MEMs components. However, the snap connectors of the prior art are designed to only work in the plane of the wafer on which the components are located (i.e., along the X and Y axes of FIGS. 8A and 8B. For instance, cantilever springs 860 and 866 form a receptacle in which barbed end 842 may be inserted in a manner that allows for an in-plane coupling to be achieved between components 870 and 880. Thus, the snap connectors of the prior art do not provide a mechanism for general assembly, but rather are only capable of coupling components in the plane of the wafer. Thus, for example, no mechanism has been disclosed in the prior art for using a snap connector for connecting a component perpendicular to the surface of a wafer to achieve 3-D assembly. That is, prior art snap connector implementations do not provide a mechanism suitable for general coupling of two microcomponents, but rather only allow for coupling of microcomponents in-plane (i.e., to achieve only 2-D assembly).

Additionally, the in-plane snap connector of the prior art lacks many characteristics that may be desired for a general coupling mechanism. For example, as shown in FIG. 8B, the snap connector works to prevent the components 870 and 880 from becoming uncoupled by a movement within the plane of the wafer (i.e., by a movement in the X or Y direction of FIGS. 8A and 8B). Although, the mating component 860 includes area 850, which permits a certain amount of "play" between the components along the X axis of FIGS. 8A and 8B. Thus, the prior art snap connector does not constrain undesirable motion/movement between the coupled components. That is, nothing prevents snap connector 840 from proceeding further inward along the X axis within the mating component 860, and thereafter the snap connector 840 may proceed outward along the X axis within the mating component 860 until the latches 862 and 864 engage the barbed end 842. Furthermore, in such prior art snap connector implementation nothing prevents the snap connector 840 from moving out of the plane of the wafer (i.e., along the Z axis of FIGS. 8A and 8B), thereby permitting the components 870 and 880 to become uncoupled. Thus, the prior art snap connector only enables 2-D assembly in which components are coupled only in two dimensions, and does not provide a connector suitable for general assembly, which may include use for performing 3-D assembly. The prior art connector requires the translator positioning component 870 relative to component 880 to exert the force required to extend cantilever springs 860 and 866. These, as well as other characteristics of the prior art 2-D snap connectors make such prior art snap connectors unsuitable for general (or "all-purpose") assembly using low or near-zero insertion force translators.

Figure 9A:
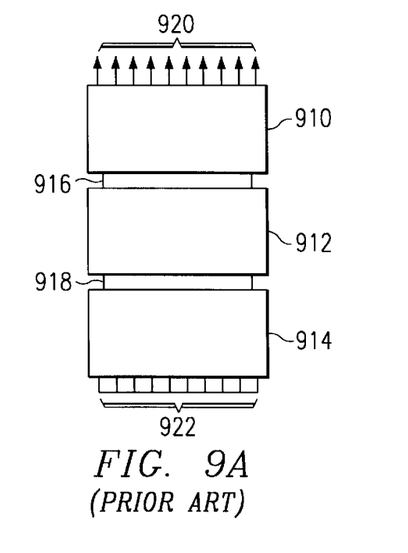
FIGS. 9A and 9B show a prior art microcomponent that comprises three hinged plates and snap locks to enable the microcomponent to be assembled into a hollow triangular beam.
Figure 9B:
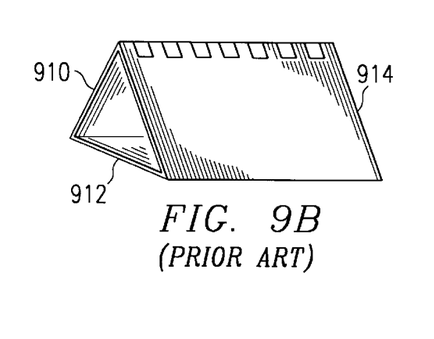

Also, "snap locks" have been proposed for use in assembling a hollow triangular beam (see e.g., *Surfaced-Micromachined Components for Articulated MicroRobots*, by Richard Yeh, Ezekiel J. J. Kruglick, and Kristofer S. J. Pister, Journal of MicroElectroMechanical Systems, Vol. 5, No. 1, March 1996). Such a prior art snap lock w proposal is shown in FIGS. 9A and 9B. As shown in FIG. 9A, a microcomponent is provided, which includes plates 910, 912, and 914. Plates 910 and 912 are rotatably coupled with a scissor hinge 916, and plates 912 and 914 are also coupled with a scissor hinge 918. Plate 910 includes snap locks 920, which may couple into mating apertures 922 of plate 914. Thus, the hollow triangular beam of FIG. 9B may be formed by rotating plate 910 and 914 upward and coupling plates 910 and 914 with snap locks 920 and mating apertures 922. Accordingly, a 3-D object is formed by assembling the three-plated microcomponent together.

However, the prior art does not teach that such snap locks are suitable for general assembly. Rather, the snap locks are used together to enable a MEMs component to assemble itself to form a hollow triangular beam, but the prior art does not teach how such snap locks may be utilized for general assembly in coupling two separate components together. Additionally, it appears that such snap lock of the prior art may lack many characteristics that may be desired for a general coupling mechanism. For example, such snap lock does not allow for coupling a component normal to the wafer surface, but instead three hinged plates are disclosed such that two plates may be coupled at approximately 60 degrees to the wafer surface. Thus, the coupled plates 910 and 914 assist in maintaining the coupling by "leaning" on each other. No teaching suggests that the snap lock disclosed may be used for a general assembly operation that does not permit such "leaning," such as two microcomponents being coupled normal to each other. Also, the pointed end 920 of the snap locks must deform during assembly. The force required for deformation needs to be provided to all 'arrowheads' simultaneously, making this a high-insertion force connector. As a result, the prior art teaching does not disclose a snap connector suitable for general assembly of microcomponents using near-zero insertion force, but rather provides only specific purpose mechanisms for assembling a specific type of MEMs component.

SUMMARY OF THE INVENTION

In view of the above, a desire exists for a coupling mechanism suitable for the assembly of microcomponents. A particular desire exists for a coupling mechanism that is suitable for performing general assembly of microcomponents, including 3-D assembly. A further desire exists for a coupling mechanism that enables microcomponents to be securely coupled to each other in a manner that constrains undesirable movement of the coupled components relative to each other.

These and other objects, features and technical advantages are achieved by a system and method which provide a pressure-fitting receptacle (or "clamp") suitable for coupling microcomponents. More specifically, a pressure-fitting receptacle is disclosed that is suitable for performing general assembly, including out-of-plane, 3-D assembly of microcomponents, wherein such microcomponents may be securely coupled together. That is, pressure-fitting receptacles are disclosed which enable microcomponents to be coupled in a manner that constrains undesirable movement of the coupled components relative to each other. Preferably, the pressure-fitting receptacles enable assembly operations utilizing a near-zero insertion force translator. For example, in one embodiment a sufficient force is provided by a relatively high force gripper to expand or "preload" engaging members (e.g., "walls") of a pressure-fitting receptacle to a desired position for engaging another component, wherein such engagement can be performed by a relatively small or near-zero force translator. Once all or a portion of a mating component is inserted within a pressure-fitting receptacle, the engaging members may be released to clamp against the mating component.

A preferred embodiment provides a "preloaded" receptacle that may be utilized to perform general assembly of microcomponents. An alternative embodiment provides a non-preloaded receptacle suitable for performing general assembly of microcomponents. Still a further alternative embodiment provides an "expansion" receptacle that is suitable for performing general assembly of microcomponents. Such pressure-fitting receptacles may be implemented as an integrated part of a microcomponent, or they may be implemented as separate, stand-alone receptacles.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims. The novel features which are believed to be characteristic of the invention, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present invention.

BRIEF DESCRIPTION OF THE DRAWING

For a more complete understanding of the present invention, and the advantages thereof, reference is now made to the following descriptions taken in conjunction with the accompanying drawing, in which.

DETAILED DESCRIPTION

The present invention provides pressure-fitting receptacles (which may also be referred to herein as "clamps" or "clamp receptacles") suitable for coupling microcomponents, and it is intended to encompass various embodiments of such receptacles. Most preferably, the pressure-fitting receptacle is an integrated part of a microcomponent. For example, a microcomponent may be fabricated such that it includes one or more pressure-fitting receptacles to enable it to be coupled to a mating microcomponent. However, the pressure-fitting receptacle may be a separate part (i.e., not integrated with the microcomponent) capable of being coupled to a microcomponent and enabling such microcomponent to then be coupled to a mating microcomponent, and any such implementation is intended to be within the scope of the present invention.

In the most general sense, a pressure-fitting receptacle is operable to couple its associated microcomponent to another microcomponent by "clamping" an insertion member of the other microcomponent. For example, a pressure-fitting receptacle typically includes an aperture having "engaging walls" around all or a portion of such aperture. Such engaging walls may be springably coupled to the pressure-fitting receptacle in a manner that enables the walls to clamp (or otherwise apply pressure) against an insertion member inserted within the receptacle's aperture. In this manner, an insertion member of a second microcomponent may be inserted within the aperture of a first microcomponent's receptacle, and the engaging walls of such aperture may clamp the insertion member, thereby coupling the first and second microcomponents together. Such a pressure-fitting receptacle may be implemented in any of various embodiments to enable a desired coupling of two or more microcomponents to be achieved, examples of which are provided hereafter. Thus, such a pressure-fitting (or "clamping") receptacle of a preferred embodiment provides a deterministic (or active) mechanism for coupling microcomponents, rather than a stochastic (or passive) mechanism such as is commonly provided by binding sites (e.g., cavities) of the prior art, for example.

Figure 1A:
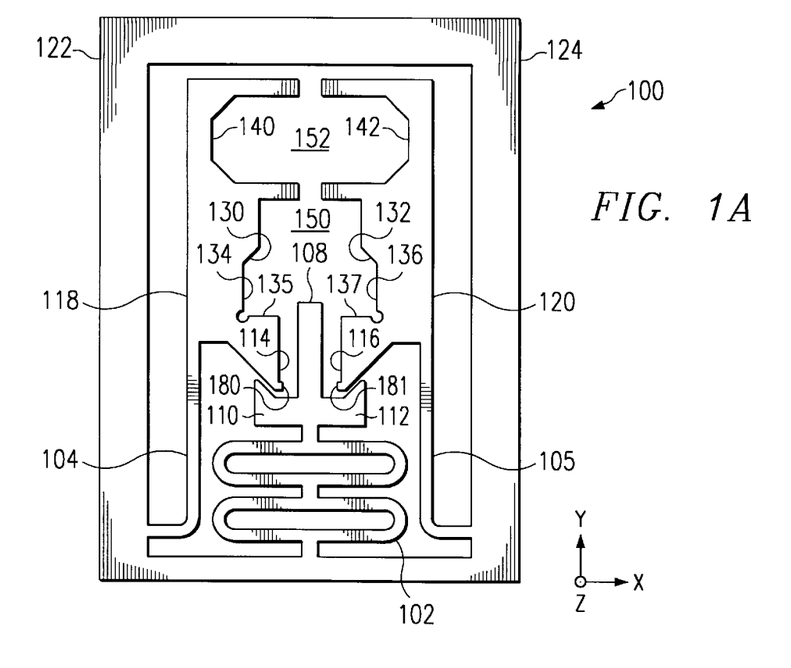
FIG. 1A shows an exemplary implementation of a preloaded pressure-fitting receptacle of a preferred embodiment.
Figure 1B:
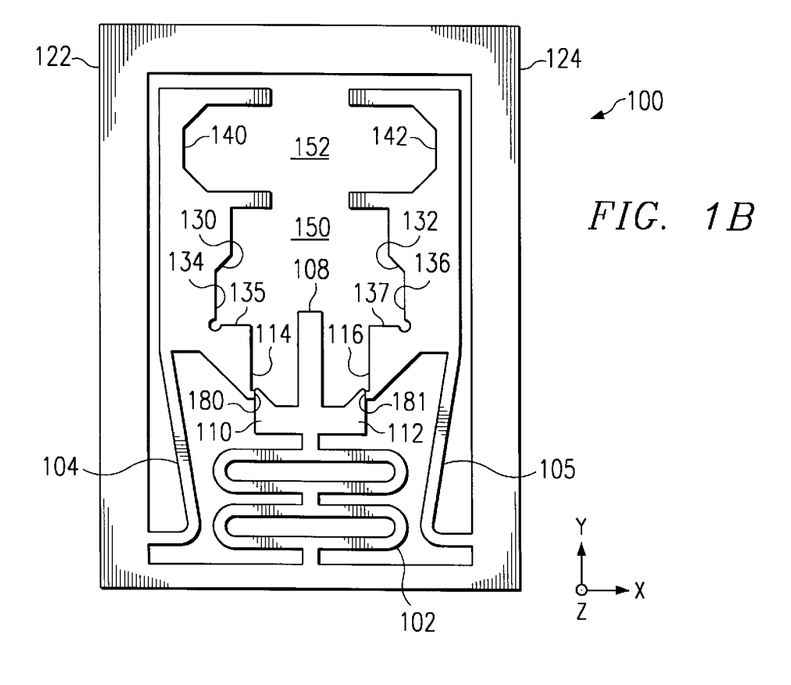
FIG. 1B shows an exemplary implementation of a preloaded pressure-fitting receptacle of a preferred embodiment that is "preloaded;"

Turning to FIGS. 1A and 1B, an exemplary implementation of a "preloaded" pressure-fit receptacle 100 of a preferred embodiment of the present invention is shown. Such preloaded pressure-fit receptacle basically comprises a spring latching mechanism that holds the receptacle's walls (i.e., "engaging walls") into position after they have been "loaded" or expanded. As shown in FIG. 1A, the preloaded receptacle 100 comprises three springs: 104, 105 and 102. Springs 104 and 105 act in the X direction of FIG. 1A, and spring 102 acts in the Y direction. As further shown in FIG. 1A, springs 104 and 105 form or are coupled with engaging walls (or "engaging members") 118 and 120 of receptacle 100.

As an exemplary operation of coupling a microcomponent that includes preloaded receptacle 100 to another microcomponent, one would use a relatively high-force gripper to engage walls 140 and 142 of aperture 152 (which may be referred to herein as a "loading aperture" or a "non-engaging aperture" because such aperture is not utilized for engaging or clamping an insertion member of a mating component) and apply an outward force to expand/separate them away from each other (i.e., along the X axis of FIG. 1A), thereby compressing springs 104 and 105. As springs 104 and 105 compress, engaging walls 118 and 120, which are coupled to springs 104 and 105, are expanded (or separated) away from each other, causing latching members 114 and 116 to be moved outward to a point at which they are held in place by retaining members 110 and 112, as shown in FIG. 1B. At this point, receptacle (or clamp) 100 is said to be "preloaded." In a most preferred embodiment, such a relatively high force gripper may be capable of providing an expansion force of approximately 500 microNewtons to approximately 5,000 microNewtons, for example. Further, in a most preferred embodiment, such preloaded receptacle 100 may require approximately 500 microNewton force, as an example, to be applied by such a gripper to walls 140 and 142 of loading aperture 152 to preload receptacle 100. Preloaded receptacle 100 also includes a release mechanism (or "trigger") 108, which may be pressed downward in the Y direction of FIG. 1A to release latching members 114 and 116 from retaining members 110 and 112. In a most preferred embodiment, a force of approximately one hundred microNewtons may be applied to cause such a release from the retaining members, for example.

Most preferably, when receptacle 100 is preloaded, engaging walls 118 and 120 of receptacle 100 are positioned to enable relatively easy insertion of (e.g., requiring relatively little insertion force) within aperture 150. Most preferably, engaging walls 118 and 120 of preloaded receptacle 100 do not contact the edges of a mating component's insertion member during coupling. As a result, if the receptacle is properly aligned respective to a mating component, friction from contact of the mating component's insertion member with engaging walls 118 and 120 of receptacle 100 may be eliminated during insertion of such insertion member within aperture 150, thereby reducing the amount of insertion force required to couple the receptacle with the mating component. In a most preferred embodiment, an insertion force of near-zero may be utilized to successfully couple the preloaded receptacle 100 with a mating component. As also shown in FIG. 1A, portions of engaging walls 118 and 120 may be angled to aid in self-aligning of receptacle 100 with the mating component, assuming that receptacle 100 and the mating component are misaligned when coupling.

Figures 2, 3B:
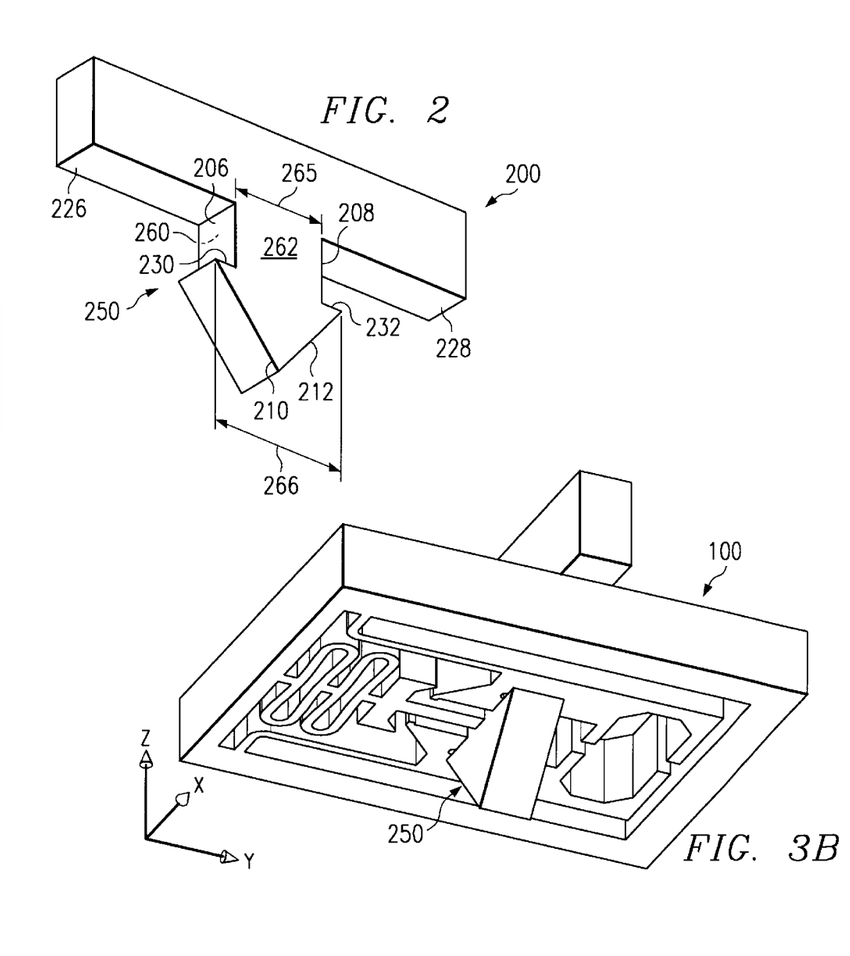
FIG. 2 shows an exemplary mating component that comprises an insertion member for penetrating an aperture of the exemplary preloaded pressure-fitting receptacle of FIGS. 1A and 1B.
FIGS. 3A and 3B show the exemplary preloaded pressure-fitting receptacle of FIGS. 1A and 1B coupled to the exemplary insertion member of FIG. 2 to achieve a coupling of their respective microcomponents.

Turning to FIG. 2, an exemplary mating microcomponent 200 having an exemplary insertion member 250 is shown. It should be understood that any type of insertion member 250 may be utilized for coupling with receptacle 100, and any such type of insertion member 250 is intended to be within the scope of the present invention. As an example, a connector as disclosed in co-pending and commonly assigned U.S. patent application Ser. No. 09/570,170 entitled "SYSTEM AND METHOD FOR COUPLING MICROCOMPONENTS," the disclosure of which is hereby incorporated herein by reference, may be utilized for coupling with receptacle 100. In operation, once receptacle 100 is preloaded (as shown in FIG. 1B), the barbed end of insertion member 250 is inserted through aperture 150 of receptacle 100. Most preferably, engaging walls 118 and 120 are loaded to a position that enables the barbed end of insertion member 250 to penetrate aperture 150 without contact being made between the barbed end and engaging walls 118 and 120 of receptacle 100, thereby reducing the amount of insertion force required to couple the microcomponents. That is, when receptacle 100 is preloaded, the width of aperture 150 (i.e., in the X direction of FIGS. 1A and 1B) is preferably greater than the width 266 of the barbed end of insertion member 250. Once the barbed end has penetrated aperture 150, insertion member 250 is moved downward (in the negative Y direction of FIGS. 1A and 1B), in-plane within receptacle 100, to engage release mechanism 108, thereby forcing release mechanism 108 downward and releasing latching mechanisms 114 and 116 from retaining mechanisms 110 and 112. That is, as release mechanism 108 is forced downward (due to the downward, in-plane force being applied by the insertion member of the mating component), spring 102 compresses, thereby moving retaining members 110 and 112 (which are coupled to spring 102) downward in the negative Y direction of FIGS. 1A and 1B. Thus, when spring 102 compresses such that retaining members 110 and 112 are moved downward to disengage latching members 114 and 116, latching members 114 and 116 return inward as springs 104 and 105 relax. That is, when latching members 114 and 116 disengage retaining members 110 and 112, springs 104 and 105 cause engaging walls 118 and 120 to return inward toward their "unloaded" position (i.e., the position of FIG. 1A), which is the biased position for springs 104 and 105. Thus, engaging walls 118 and 120 clamp (or pressure-fit) against insertion member 250, thereby coupling the microcomponent associated with receptacle 100 to microcomponent 200 associated with insertion member 250.

Figure 3A:
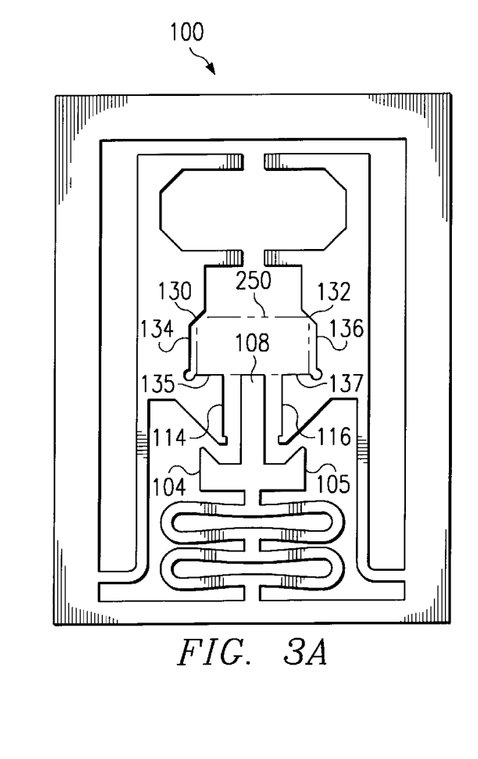

At that point, in a preferred embodiment, engaging wall 118 applies a force toward side 206 of insertion member 250 of mating component 200, and engaging wall 120 applies a force toward side 208 of insertion member 250 of mating component 200 (as shown in FIGS. 3A and 3B). In a most preferred embodiment, engaging walls 118 and 120 each apply a force of approximately one hundred fifty microNewtons to approximately two hundred microNewtons, as an example, toward sides 206 and 208, respectively. In a preferred embodiment, back side 260 of insertion member 250 engages angled side (or "wedge side") 130 of engaging wall 118, and front side 262 of insertion member 250 engages side 135 of engaging wall 118. Likewise, in a preferred embodiment, back side 260 of insertion member 250 engages angled side (or "wedge side") 132 of engaging wall 120, and front side 266 of insertion member 250 engages side 137 of engaging wall 120. As shown in phantom in FIG. 3A, sides 134 and 136 of engaging walls 118 and 120 may not actually engage (or contact) the sides of insertion member 250 in a preferred embodiment. However, in alternative embodiments, the receptacle walls and/or the mating component may be implemented such that sides 134 and 136 of engaging walls 118 and 120 do engage the sides of insertion member 250. For example, an implementation may be desirable in which engagement of sides 134 and 136 with the sides of insertion member 250 is desirable in that it provides an increased amount of surface area in contact, thereby increasing the amount of force required to disengage the mated component from receptacle 100.

Additionally, as shown in FIG. 2, insertion member 250 most preferably includes a barbed end having retaining surfaces 230 and 232 to engage the underside of receptacle 100. Furthermore, mating component 200 may include "constrained surfaces" 226 and 228, which come into contact with "complementary surfaces" 122 and 124 of receptacle 100. As shown in FIG. 3B, retaining surfaces 230 and 232 of exemplary insertion member 250 apply a force against the underside of the receptacle 100 to aid in maintaining a secure connection between a mating component and receptacle 100 (e.g., such that constrained surfaces 226 and 228 are maintained flush against complementary surfaces 122 and 124 of receptacle 100). As a result, receptacle 100, along with insertion member 250, work to securely couple their associated microcomponents together.

Turning to FIGS. 3A and 3B, an exemplary illustration of receptacle 100 coupled to a mating component 200 is shown. FIG. 3A shows a cross-sectional view of exemplary receptacle 100 of FIGS. 1A and 1B coupled to exemplary insertion member 250 of FIG. 2. As shown in FIG. 3A, in a most preferred embodiment, angled side (or "wedge side") 130 of engaging wall 118 engages back side 260 of insertion member 250, and side 135 of engaging wall 118 engages front side 262 of insertion member 250. Likewise, in a most preferred embodiment, angled side (or "wedge side") 132 of engaging wall 120 engages back side 260 of insertion member 250, and side 137 of engaging wall 120 engages front side 266 of insertion member 250. As shown in phantom in FIG. 3A, sides 134 and 136 of engaging walls 118 and 120 do not actually engage (or contact) the sides of insertion member 250 in a most preferred embodiment. However, as discussed above, in alternative embodiments, the receptacle walls and/or the mating component may be implemented such that sides 134 and 136 of engaging walls 118 and 120 do engage the sides of insertion member 250.

FIG. 3B shows an isometric view of exemplary receptacle 100 of FIGS. 1A and 1B coupled to exemplary insertion member 250 of FIG. 2. As shown, in a most preferred embodiment, retaining surfaces 230 and 232 of the barbed end of insertion member 250 engage the undersides of receptacle 100, respectively, to aid in maintaining receptacle 100 coupled to insertion member 250. As further shown, in a most preferred embodiment, retaining surfaces 230 and 232 may be implemented to maintain sufficient force against the underside of receptacle 100 such that constrained surfaces 226 and 228 of mating component 200 remain in flush contact against complementary surfaces 122 and 124 of receptacle 100. As discussed above, insertion member 250 may be implemented as arms of a connector as disclosed in co-pending and commonly assigned U.S. patent application Ser. No. 09/570,170 entitled "SYSTEM AND METHOD FOR COUPLING MICROCONTONENTS," the disclosure of which is hereby incorporated herein by reference.

In a most preferred embodiment, pressure-fitting receptacle 100 allows for coupled microcomponents to be de-coupled. For example, in a most preferred implementation, a gripper may be utilized to engage walls 140 and 142 of loading aperture 152 and apply an outward force to expand engaging walls 118 and 120 away from each other. Once engaging walls 118 and 120 have been sufficiently expanded, the barbed end of insertion member 250 may then be extracted from aperture 150 of receptacle 100, thereby de-coupling microcomponent 200 from the associated microcomponent of receptacle 100. In a preferred implementation, the barbed end of insertion member 250 may be disengaged from receptacle 100 without contact being made between the barbed end and engaging walls 118 and 120 of receptacle 100, thereby reducing the amount of extraction force required to de-couple the microcomponents. In a most preferred implementation, pressure-fitting receptacle 100 may then be reused to couple its associated component with another mating component. As a result, preloaded receptacle 100 provides a disengageable and/or reusable pressure-fitting receptacle for coupling microcomponents.

It should be recognized that in some implementations loading aperture 152 may not be included within preloaded receptacle 100. For example, in an implementation in which de-coupling of coupled microcomponents is not desired, loading aperture 152 may be omitted from preloaded receptacle 100. In such an implementation, a user may preload receptacle 100 by applying an outward (or "expansive") force against the inner sides 134 and 136 of engaging walls 118 and 120. Any such implementation is intended to be within the scope of the present invention.

It should be recognized that receptacle (or "clamp") 100 of a preferred embodiment may be utilized for general assembly of microcomponents. That is, receptacle 100 is suitable for performing out-of-plane, 3-D assembly of microcomponents. When utilized for out-of-plane, 3-D assembly of microcomponents, the receptacle of a preferred embodiment, receptacle 100, along with a complementary insertion member 250, can be utilized to restrict all three degrees of freedom between the coupled components. In a preferred embodiment, receptacle 100, along with a complementary insertion member 250 of a mating component, enable out-of-plane, 3-D assembly to be achieved in a manner that enables components to be securely coupled. Thus, for example, a mating microcomponent may be "picked up" out of the plane of a microcomponent comprising receptacle 100, and such mating microcomponent may be securely assembled to such microcomponent comprising receptacle 100, resulting in a 3-D device. For example, a first component may be "picked up" off a wafer, rotated such that it is normal to ascend component having receptacle 100 on such wafer, and then securely coupled to the second component.

As shown in the exemplary implementation of FIGS. 3A and 3B, the secure coupling provided between receptacle 100 and insertion member 250 may restrict all three degrees of linear freedom of the coupled components, respective to each other, as well as restricting rotational degrees of freedom with respect to each other. Accordingly, receptacle 100, along with a complementary insertion member, works to prevent the coupled components from moving linearly with respect to each other to prevent such coupled components from disengaging. More specifically, receptacle 100 and complementary insertion member 250 work to prevent one of the coupled components from moving in either the X, Y, or Z directions of FIGS. 3A and 3B with respect to the other coupled component. More specifically, receptacle 100 and insertion member 250 of mating component 200 work together to prevent such movement in a preferred embodiment. That is, both components may together move in either the X, Y, or Z directions, but receptacle 100 and insertion member 250 work to prevent only one of the coupled components from moving in such directions without the other component also moving in such directions. Furthermore, receptacle 100 and insertion member 250 work to prevent the coupled components from rotating respective to each other. That is, both components may together rotate, but receptacle 100, in combination with the insertion member 250, works to prevent only one of the coupled components from rotating without the other component also rotating in a like manner.

It should also be recognized that aperture 150 of receptacle 100, as well as insertion member 250 of mating component 200, may be implemented to aid in allowing receptacle 100 to be self-positioning or self-centering with mating component 200. For example, inner sides 130, 132, 134, 135, 136, and 137 of engaging walls 118 and 120 may be designed to receive the barbed end of insertion member 250 in a manner that may aid in self-aligning receptacle 100 with mating component 200. Additionally, springs 104 and 105 may also aid in the self-aligning of receptacle 100 by enabling engaging walls 118 and 120 some flexibility along the X axis of FIGS. 1A and 1B. Such self-aligning is a desirable feature to aid in precise assembly of the microcomponents. For example, if positional assembly is being performed with no feedback to the assembly mechanism (i.e., the assembly is dependent on the accurate positioning of the components to be assembled), such self-aligning feature is desirable because it allows for small positional errors to be present for the components to be assembled.

Also, it should be recognized that the receptacle's springs may be fabricated in separate layers of the receptacle 100. For instance, springs 104 and 105, which operate in the X direction, may be in polysilicon layer 1 of the receptacle 100, and spring 102, which operates in the Y direction, may be in polysilicon layer 2. Various fabrication techniques may be utilized to achieve the springs in differing layers, including, as examples, those fabrication processes disclosed in U.S. Pat. No. 4,740,410 issued to Muller et al. entitled "MICROMECHANICAL ELEMENTS AND METHODS FOR THEIR FABRICATION," U.S. Pat. No. 5,660,680 issued to Chris Keller entitled "METHOD FOR FABRICATION OF HIGH VERTICAL ASPECT RATIO THIN FILM STRUCTURES," U.S. Pat. No. 5,645,684 issued to Chris Keller entitled "MULTILAYER HIGH VERTICAL ASPECT RATIO THIN FILM STRUCTURES," as well as the fabrication process disclosed in concurrently filed and commonly assigned U.S. patent application Ser. No. 09/569,330 entitled "METHOD AND SYSTEM FOR SELF-REPLICATING MANUFACTURING STATIONS." However, it should be recognized that receptacle 100 may be implemented with all of its springs in the same layer, and any such implementation is intended to be within the scope of the present invention.

Furthermore, it should be recognized that only a very small insertion force may be required to couple the microcomponents using preloaded receptacle 100. Basically, the force for inserting insertion member 250 within aperture 150 is near zero in a most preferred embodiment (e.g., because insertion member 250 does not contact the side of aperture 150 during insertion). Thereafter, a downward force in the Y direction (applied in-plane within receptacle 100) may be applied, which must be just large enough to release releasing mechanism 108. That is, the downward, in-plane force must be just great enough to overcome spring 102 and the frictional force between latching mechanisms 114 and 116 and their respective retaining mechanisms 110 and 112 to enable releasing mechanism 108 to be moved along the Y axis to release such latching mechanisms 114 and 116. Most preferably, spring 102 is relatively weak, thereby reducing the amount of force required to couple receptacle 100 to a mating component 200. In fact, the frictional forces between latching mechanisms 114 and 116 and their respective retaining mechanisms 110 and 112 may be greater than the strength of spring 102, resulting in spring 102 being negligible in determining the amount of downward force required for coupling. As shown in FIGS. 1A and 1B, latching mechanisms 114 and 116 preferably have a protruding portion (which may also be referred to as a "dimple" or "bump"), shown as 180 and 181 respectively. Such protruding portions 180 and 181 work to reduce the amount of surface area in contact between latching mechanisms 114 and 116 and their respective retaining mechanisms 110 and 112 when the receptacle 100 is preloaded, thereby reducing the amount of friction and the amount of downward force required for coupling. Thus, the downward force applied in-plane within receptacle 100 may be dependent on the strength of spring 102 and the frictional forces between latching mechanisms 114 and 116 and their respective retaining mechanisms 110 and 112.

In view of the exemplary implementation described above, it should be recognized that various other implementations of preloaded receptacles are possible, and any such implementations are intended to be within the scope of the present invention. Thus, the present invention is not intended to be limited only to the implementations of a preloaded receptacle provided herein, but rather such implementations are intended solely as examples that render the disclosure enabling for many other implementations of a preloaded receptacle. For example, the latching mechanism(s) and release mechanism(s) of a preloaded receptacle may be implemented in any number of ways, and any such implementation is intended to be within the scope of the present invention.

Figure 4:
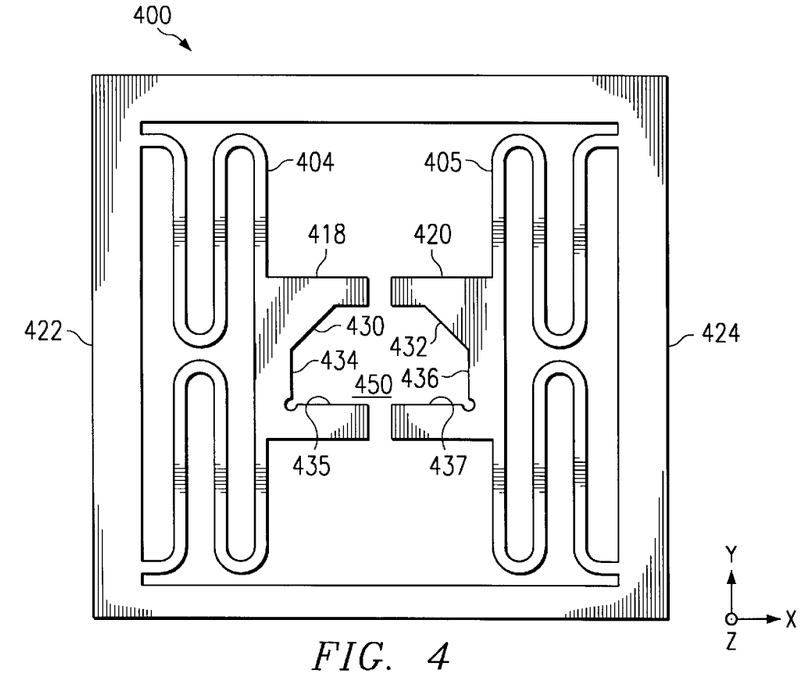
FIG. 4 shows an exemplary implementation of a non-preloaded pressure-fitting receptacle of an alternative embodiment.

As described above, a preferred embodiment utilizes a preloaded receptacle for coupling microcomponents. An alternative embodiment may be implemented utilizing a non-preloaded receptacle to achieve such coupling. Various implementations of non-preloaded receptacles are possible. Turning to FIG. 4, a first exemplary implementation of a non-preloaded receptacle 400 is shown. The exemplary receptacle 400 comprises two springs, shown as 404 and 405. Springs 404 and 405 act in the X direction of FIG. 4. In a most preferred embodiment, the dimensions of springs 404 and 405 (i.e., the "X-direction springs") are the same. The X-direction springs 404 and 405 form or are coupled to "engaging walls" 418 and 420, respectively.

As an exemplary operation of coupling a microcomponent that includes receptacle 400 to another "mating" microcomponent, one may utilize a gripper, such as tweezers, to insert an insertion member of such mating microcomponent within aperture 450 of receptacle 400. More specifically, a mating component, such as component 200 of FIG. 2, may include an insertion member, such as insertion member 250 of FIG. 2. Such insertion member 250 preferably includes a barbed end, as shown in FIG. 2, which may be inserted through aperture 450. In this embodiment, the width of aperture 450 (i.e., in the X-direction of FIG. 4) when springs 404 and 405 are relaxed is smaller than the width 266 of the barbed end of insertion member 250. Most preferably, such width of aperture 450 when springs 404 and 405 are relaxed is slightly smaller than the width 265 of insertion member 250. Accordingly, as the barbed end of insertion member 250 is inserted within aperture 450, the insertion sides 210 and 212 engage (or "contact") the edges 434 and 436 of aperture 450. If sufficient insertion force is provided, springs 404 and 405 will expand (or separate) away from each other (i.e., along the X axis of FIG. 4), thereby allowing the barbed end of insertion member 250 to penetrate through aperture 450. In a most preferred embodiment, an insertion force of approximately three hundred microNewtons to approximately five hundred microNewtons, as an example, may be utilized to successfully penetrate an insertion member 250 through aperture 450 of receptacle 400.

Once the barbed end is inserted through aperture 450, the expansion (or separation) force applied by such barbed end on springs 404 and 405 is no longer present. Accordingly, springs 404 and 405 will release inward toward each other and apply a force toward the sides (or "edges") 206 and 208 of insertion member 250 of mating component 200, in a manner similar to that discussed above in conjunction with FIGS. 3A and 3B. In a most preferred embodiment, springs 404 and 405 cause engaging walls 418 and 420 to each apply a force of approximately two hundred microNewtons, as an example, toward sides 206 and 208, respectively. Furthermore, insertion member 250 preferably includes a barbed end having retention sides 230 and 232, which engage the underside of receptacle 400, and constrained surfaces 226 and 228 of mating component 200 preferably engage the upper side of receptacle 400, shown as 422 and 424. As a result, non-preloaded receptacle 400 works to securely couple its associated component to mating component 200.

It should be recognized that such a non-preloaded receptacle 400 may be utilized for general assembly of microcomponents, just as described above for the preloaded receptacle embodiment. When utilized for out-of-plane, 3-D assembly of microcomponents, a preferred embodiment of receptacle 400 can be utilized to restrict all three degrees of freedom between the coupled components. A preferred embodiment of receptacle 400 enables out-of-plane, 3-D assembly to be achieved in a manner that enables components to be securely coupled. Thus, a microcomponent may be "picked up" out of the plane of a mating component and securely assembled to such mating component, resulting in a 3-D device. For example, one component on a wafer may be "picked up" off the wafer, rotated such that it is normal to a mating component on such wafer, and then securely coupled to the mating component.

Figure 5:
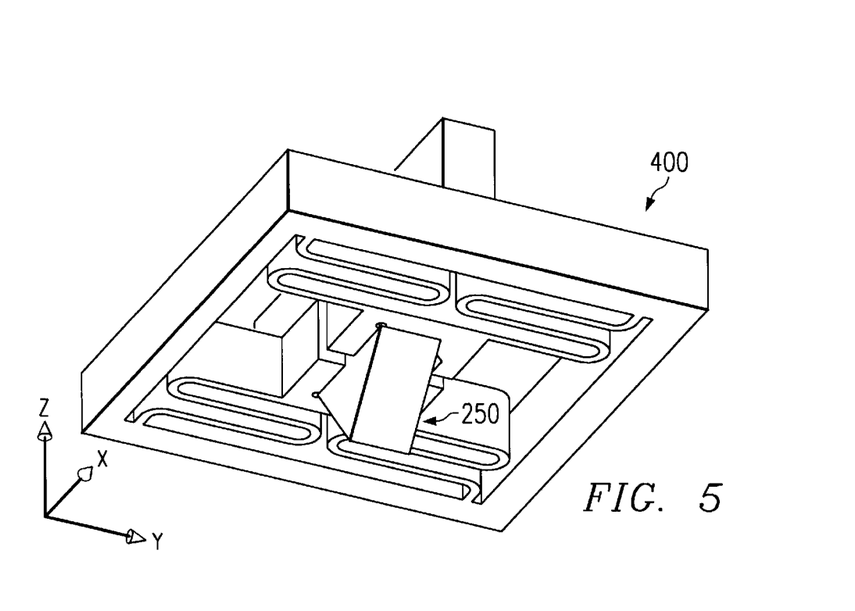
FIG. 5 shows the exemplary non-preloaded pressure-fitting receptacle of FIG. 4 coupled to the exemplary insertion member of FIG. 2 to achieve a coupling of their respective microcomponents.

Receptacle 400 preferably engages (or clamps) insertion member 250 in a manner similar to that shown in FIG. 5. As shown in FIG. 5, the secure coupling provided between receptacle 400 and insertion member 250 may restrict all three degrees of linear freedom of the coupled components, respective to each other, as well as restricting rotational degrees of freedom with respect to each other. Accordingly, receptacle 400, along with a complementary insertion member, works to prevent the coupled microcomponents from moving linearly with respect to each other to prevent such coupled microcomponents from disengaging. More specifically, receptacle 400 and complementary insertion member 250 work to prevent one of the coupled components from moving in either the X, Y, or Z directions of FIG. 5 with respect to the other coupled component. More specifically, receptacle 400 and insertion member 250 of mating component 200 work together to prevent such movement in a preferred embodiment. That is, both components may together move in either the X, Y, or Z directions, but receptacle 400 and insertion member 250 work to prevent only one of the coupled components from moving in such directions without the other component also moving in such directions. Furthermore, receptacle 400 and insertion member 250 work to prevent the coupled components from rotating respective to each other. That is, both components may together rotate, but receptacle 400, in combination with the insertion member 250, works to prevent only one of the coupled components from rotating without the other component also rotating in a like manner.

It should also be recognized that aperture 450 of receptacle 400, as well as insertion member 250 of mating component 200, may be implemented to aid in allowing receptacle 400 to be self-positioning or self-centering with mating component 200. For example, inner sides 430, 432, 434, 435, 436, and 437 of engaging walls 418 and 420 may be designed to receive the barbed end of insertion member 250 in a manner that may aid in self-aligning receptacle 400 with mating component 200. Additionally, springs 404 and 405 may also aid in the self-aligning of receptacle 400 by enabling engaging walls 418 and 420 some flexibility along the X axis of FIG. 4. Such self-aligning is a desirable feature to aid in precise assembly of the microcomponents. For example, if positional assembly is being performed with no feedback to the assembly mechanism (i.e., the assembly is dependent on the accurate positioning of the components to be assembled), such self-aligning feature is desirable because it allows for small positional errors to be present for the components to be assembled.

It should be recognized that the insertion force required for coupling components with this alternative embodiment is greater than the force that may be required for coupling components utilizing a preloaded receptacle of a preferred embodiment. For example, in this alternative embodiment, an insertion member 250 is inserted within aperture 450 in a manner such that insertion member 250 contacts engaging walls 418 and 420 during insertion. Thus, sufficient insertion force is required to overcome springs 404 and 405 (i.e., to cause such springs to compress) and to overcome the frictional forces between the barbed end of insertion member 250 and the inner sides of aperture 450 (e.g., sides 434 and 436) to enable the barbed end of insertion member 250 to penetrate aperture 250.

In view of the exemplary implementation described above, it should be recognized that various other implementations of non-preloaded receptacles are possible, and any such implementations are intended to be within the scope of the present invention. Thus, the present invention is not intended to be limited only to the implementations of a non-preloaded receptacle provided herein, but rather such implementations are intended solely as examples that render the disclosure enabling for many other implementations of a non-preloaded receptacle. For example, aperture 450 may have a different shape and/or inner sides 430, 432, 434, 435, 436, and 437 may be angled in a different manner respective to each other to enable receptacle 400 to achieve a desirable clamp on an insertion member, and any such implementation is intended to be within the scope of the present invention.

Figure 6:
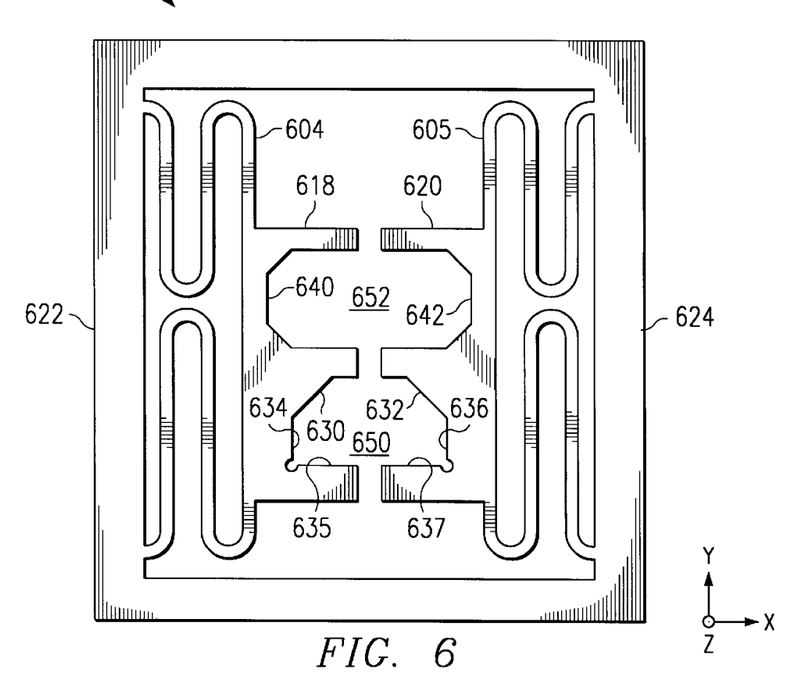
FIG. 6 shows an exemplary implementation of a "expansion receptacle" of a further alternative embodiment.

Turning now to FIG. 6, an example of a further alternative embodiment of a pressure-fitting receptacle (or "clamp") that may be implemented to achieve coupling of two microcomponents is shown. The alternative embodiment of FIG. 6 may be referred to herein as an "expansion" receptacle (or expansion clamp). Such an expansion receptacle may be utilized to couple components in a manner that requires near-zero insertion force to be exerted. The exemplary expansion receptacle 600 of FIG. 6 comprises two springs, shown as 604 and 605, which act in the X direction of FIG. 6. In a most preferred embodiment, the dimensions of springs 604 and 605 are the same. Springs 604 and 605 each form or are coupled to engaging walls 618 and 620, respectively.

As an example of the operation of expansion receptacle 600 of FIG. 6, one may utilize a relatively high-force gripper to engage walls 640 and 642 of aperture 652 (which may be referred to herein as a "positioning aperture" or a "nonengaging aperture" because aperture 652 is not utilized for clamping an insertion member of a mating component) and apply an outward force to expand/separate them away from each other (i.e., along the X axis of FIG. 6). As walls 640 and 642 are expanded or separated causing springs 604 and 605 to compress, engaging walls 618 and 620, which are also coupled to springs 604 and 605, likewise expand (or separate). Such an expansion force applied by a gripper is maintained while an insertion member, such as insertion member 250 of FIG. 2, is inserted within aperture 650 of receptacle 600. That is, engaging walls 618 and 620 are maintained expanded (or separated) to enable an insertion member to be inserted within aperture 650 with very little insertion force. In a most preferred embodiment, such expansion receptacle 600 may require approximately five-hundred microNewton force to approximately one-thousand microNewton force, as an example, to be applied by such a gripper to walls 640 and 642 of positioning aperture 652 to sufficiently expand engaging walls 618 and 620 for inserting an insertion member within aperture 650.

Once a sufficient expansion force is applied to properly expand engaging walls 618 and 620, the barbed end of an insertion member, such as insertion member 250 of FIG. 2, is inserted through aperture 650. In this embodiment, the width of aperture 650 (i.e., in the X-direction of FIG. 6) is smaller than the width 266 of the barbed end of insertion member 250 when springs 604 and 605 are relaxed. Most preferably, when springs 604 and 605 are relaxed, such width of aperture 650 is slightly smaller than the width 265 of the portion of insertion member 250 that is engaged (or clamped) by receptacle 600. The gripper may be utilized to expand engaging walls 618 and 620 away from each other to a position at which the barbed end of insertion member 250 may be inserted through aperture 650 without contact between such barbed end and the inner sides of aperture 650. That is, in a preferred implementation of receptacle 600, engaging walls 618 and 620 may be separated away from each other to a point at which no contact is made between the barbed end of insertion member 250 and the edges of aperture 650, thereby reducing the amount of insertion force required to couple the respective microcomponents to near-zero.

Once the barbed end of insertion member 250 is inserted through aperture 650, the gripper may then terminate the expansion force applied against sides 640 and 642 of positioning aperture 652, enabling receptacle 600 to clamp insertion member 250. That is, once the expansion force is removed, engaging walls 618 and 620 will release inward toward each other and apply a force toward the sides (or "edges") 206 and 208 of insertion member 250 of mating component 200, in a manner similar to that discussed above in conjunction with FIGS. 3A and 3B. In a most preferred embodiment, springs 604 and 605 cause engaging walls 618 and 620 to each apply a force of approximately two hundred microNewtons, as an example, toward sides 206 and 208, respectively. Furthermore, insertion member 250 preferably includes a barbed end having retention sides 230 and 232, which engage the underside of receptacle 600, and constrained surfaces 226 and 228 of mating component 200 preferably engage the upper side of receptacle 600, shown as 622 and 624. As a result, expansion receptacle 600 works to securely couple its associated component to mating component 200.

In view of the above, expansion receptacle 600 may be coupled with a mating component 200 with a near-zero insertion force being required. Because the receptacle's engaging walls 618 and 620 may be initially expanded (or separated) away from each other, the barbed end of insertion member 250 may be inserted through aperture 650 with no contact therebetween, thus enabling coupling to be achieved with a near-zero insertion force.

In a preferred implementation, expansion receptacle 600 may be disengaged by basically repeating the steps utilized for coupling expansion receptacle 600 to a mating component 200. That is, a gripper may be utilized to engage sides 640 and 642 of positioning aperture 652, and apply a force to compress springs 604 and 605, thereby expanding engaging walls 618 and 620 away from each other. Once engaging walls 618 and 620 have been sufficiently expanded away from each other, the barbed end of insertion member 250 may be extracted through aperture 650 of receptacle 600, thereby disengaging receptacle 600 from mating component 200. In a preferred implementation, engaging walls 618 and 620 of receptacle 600 may be sufficiently separated away from each other such that the barbed end of insertion member 250 may be disengaged from aperture 650 without contact being made between the barbed end and the inner sides of aperture 650, thereby reducing the amount of extraction force required to de-couple the components. In a most preferred implementation, expansion receptacle 600 may then be reused to couple its associated component with another mating component. As a result, expansion receptacle 600 provides a disengageable and/or reusable pressure-fitting receptacle.

It should be recognized that such an expansion receptacle 600 may be utilized for general assembly of microcomponents, just as described above for the preloaded receptacle embodiment. When utilized for out-of-plane, 3-D assembly of microcomponents, a preferred embodiment of receptacle 600 can be utilized to restrict all three degrees of freedom between the coupled components. A preferred embodiment of receptacle 600 enables out-of-plane, 3-D assembly to be achieved in a manner that enables components to be securely coupled. Thus, a microcomponent may be "picked up" out of the plane of a mating component and securely assembled to such mating component, resulting in a 3-D device. For example, one component on a wafer may be "picked up" off the wafer, rotated such that it is normal to a mating component on such wafer, and then securely coupled to the mating component.

Figure 7:
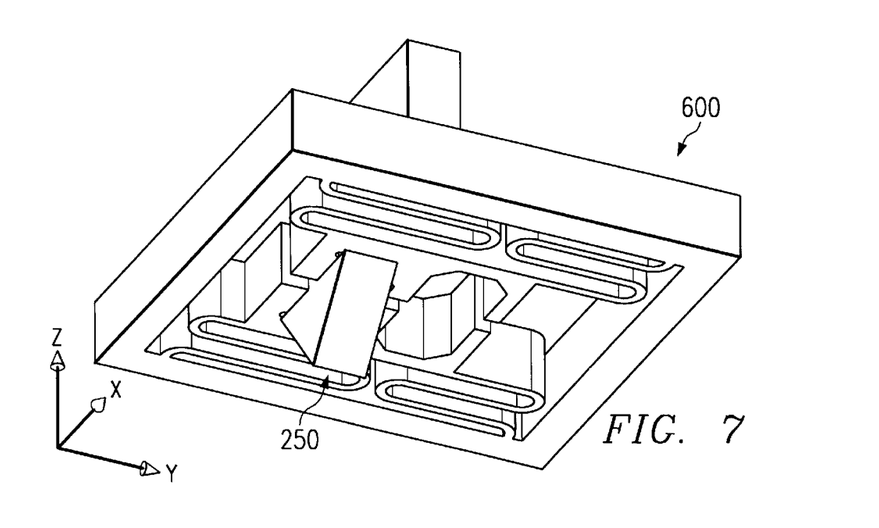
FIG. 7 shows the exemplary expansion receptacle of FIG. 6 coupled to the exemplary insertion member of FIG. 2 to achieve a coupling of their respective microcomponents.

Receptacle 600 preferably engages (or clamps) insertion member 250 in a manner similar to that shown in FIG. 7. As shown in FIG. 7, the secure coupling provided between receptacle 600 and insertion member 250 may restrict all three degrees of linear freedom of the coupled components, respective to each other, as well as restricting rotational degrees of freedom with respect to each other. Accordingly, receptacle 600, along with a complementary insertion member, works to prevent the coupled microcomponents from moving linearly with respect to each other to prevent such coupled microcomponents from disengaging. More specifically, receptacle 600 and complementary insertion member 250 work to prevent one of the coupled components from moving in either the X, Y, or Z directions of FIG. 7 with respect-to the other coupled component. More specifically, receptacle 600 and insertion member 250 of mating component 200 work together to prevent such movement in a preferred embodiment. That is, both components may together move in either the X, Y, or Z directions, but receptacle 600 and insertion member 250 work to prevent only one of the coupled components from moving in such directions without the other component also moving in such directions. Furthermore, receptacle 600 and insertion member 250 work to prevent the coupled components from rotating respective to each other. That is, both components may together rotate, but receptacle 600, in combination with the insertion member 250, works to prevent only one of the coupled components from rotating without the other component also rotating in a like manner.

It should also be recognized that aperture 650 of receptacle 600, as well as insertion member 250 of mating component 200, may be implemented to aid in allowing receptacle 600 to be self-positioning or self-centering with mating component 200. For example, inner sides 630, 632, 634, 635, 636, and 637 of engaging walls 618 and 620 may be designed to receive the barbed end of insertion member 250 in a manner that may aid in self-aligning receptacle 600 with mating component 200. Additionally, springs 604 and 605 may also aid in the self-aligning of receptacle 600 by enabling engaging walls 618 and 620 some flexibility along the X axis of FIG. 6. Such self-aligning is a desirable feature to aid in precise assembly of the microcomponents. For example, if positional assembly is being performed with no feedback to the assembly mechanism (i.e., the assembly is dependent on the accurate positioning of the components to be assembled), such self-aligning feature is desirable because it allows for small positional errors to be present for the components to be assembled.

In view of the exemplary implementation described above, it should be recognized that various other implementations of expansion receptacles are possible, and any such implementations are intended to be within the scope of the present invention. Thus, the present invention is not intended to be limited only to the implementations of an expansion receptacle provided herein, but rather such implementations are intended solely as examples that render the disclosure enabling for many other implementations of expansion receptacles. For example, aperture 650 may have a different shape and/or inner sides 630, 632, 634, 635, 636, and 637 may be angled in a different manner respective to each other to enable receptacle 600 to achieve a desirable clamp on an insertion member, and any such implementation is intended to be within the scope of the present invention. Furthermore, positioning aperture 652 may similarly have a different shape to enable a gripper to engage such aperture 652 to expand engaging walls 618 and 620 to enable near-zero insertion force coupling of microcomponents to be achieved.

Most preferably, the pressure-fitting receptacle embodiments described above are an integrated part of their associated microcomponents. For example, a microcomponent may be fabricated such that it includes one or more of such pressure-fitting receptacle embodiments to enable it to be coupled to a mating microcomponent. However, the pressure-fitting receptacle embodiments may instead be implemented as a separate part (i.e., not integrated with the microcomponent) that is capable of being coupled to a microcomponent and enabling such microcomponent to then be coupled to a mating microcomponent.

It should be understood that the pressure-fitting receptacles of the present invention may include further enhancements, which are intended to be within the scope of the present invention. For example, such receptacles may include conductive traces (e.g., gold) therein, in a manner that enables the pressure-fitting receptacles to provide electrical couplings between mated components. An example of an electrical connector (e.g., insertion member) that may be utilized with such a pressure-fitting receptacle having conductive traces included therein is disclosed in concurrently filed and commonly assigned U.S. patent application Ser. No. 09/569,328 entitled "RIBBON CABLE AND ELECTRICAL CONNECTOR FOR USE WITH MICROCOMPONENTS," the disclosure of which is hereby incorporated herein by reference. As another example, such pressure-fitting receptacles may be implemented to simultaneously clamp two or more insertion members, thereby allowing for two or more microcomponents to be securely clamped together by such receptacle.

It should be understood that the actual coupling of microcomponents may be performed in any manner now known or later developed, including but not limited to the microcomponents being coupled by a user, by a robotic assembly mechanism, or by any other type of assembly mechanism, and any such method of coupling is intended to be within the scope of the present invention. It should also be understood that, as described above, the pressure-fitting receptacle and insertion member may be designed to enable the microcomponents to be self-aligning in order to ease the coupling operation.

It should be recognized that the embodiments disclosed herein for pressure-fitting receptacles may be implemented for small-scale receptacles. For example, the receptacles of the various embodiments disclosed herein may have a size of approximately one hundred microns by one hundred microns, as an example. Accordingly, such receptacles may have a surface area of approximately ten thousand square microns, as an example, and a volume of approximately one hundred thousand cubic microns, as an example. Of course, various implementations of pressure-fitting receptacles having any size that is smaller or larger than such exemplary sizes are intended to be within the scope of the present invention.

It should be recognized that the embodiments disclosed herein enable a "pressure fit" to be achieved between a receptacle and a mating component. For example, springs that are biased in a manner to cause the inner walls of an aperture to apply a force against an insertion member of a mating component that is inserted within such an aperture enables the receptacle to be pressure fit with a mating component (e.g., apply a clamping force against the insertion member of a mating component). Of course, such a pressure fit between the receptacle and mating component may be achieved in any manner now known or later developed. Thus, the present invention is not intended to be limited solely to achieving a pressure fit between a receptacle and a mating component by utilizing springs within the receptacle, but rather any type of pressure fitting implementation is intended to be within the scope of the present invention.

It should also be understood that the directional references have been utilized herein solely for reference, and are not intended as limitations on the various embodiments described. Rather, such embodiments may be oriented in any desirable manner.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A pressure-fitting receptacle for coupling at least two microcomponents, comprising:

at least one aperture;

at least one engaging wall for engaging an insertion member of at least a first microcomponent inserted within said at least one aperture;

said at least one engaging wall implemented to be pressure fit with said insertion member; and wherein said pressure-fitting receptacle is capable of engaging said at least a first microcomponent in a manner that constrains translational freedom of said at least a first microcomponent relative to said pressure-fitting receptacle in three dimensions and wherein said constraint of translational freedom is not solely frictional in any of said three dimensions.

2. The pressure-fitting receptacle of claim 1 wherein said pressure-fitting receptacle has a size less than approximately two hundred microns by two hundred microns.

3. The pressure-fitting receptacle of claim 1 wherein said pressure-fitting receptacle is capable of engaging said at least a first microcomponent in a manner that further constrains rotational freedom of said at least a first microcomponent relative to said pressure-fitting receptacle.

4. The pressure-fitting receptacle of claim 1 further comprising:

at least one non-engaging aperture having inner sides against which a force may be applied for expanding said aperture to enable insertion of said insertion member within said aperture.

5. The pressure-fitting receptacle of claim 1 wherein said at least one engaging wall is movable relative to said at least one aperture, said pressure-fitting receptacle further comprising:
   at least one latch mechanism for latching said at least one engaging wall to a position for a desired coupling of said at least a first microcomponent.

6. The pressure-fitting receptacle of claim 5 wherein said position for a desired coupling is a position that enables said insertion member to penetrate said aperture without contacting the edges of said aperture.

7. The pressure-fitting receptacle of claim 5 wherein said position for a desired coupling is a position that enables said insertion member to penetrate said aperture with a minimal insertion force applied.

8. The pressure-fitting receptacle of claim 7 wherein said insertion force is a near-zero insertion force.

9. The pressure-fitting receptacle of claim 5 further comprising:
   at least one release mechanism for releasing said at least one engaging wall to enable said at least one engaging wall to clamp said insertion member to couple said pressure-fitting receptacle with said at least a first microcomponent.

10. The pressure-fitting receptacle of claim 9 wherein said at least one release mechanism is arranged to release said at least one engaging wall as said insertion member is moved in-plane within said aperture to apply a force against said at least one release mechanism.

11. The pressure-fitting receptacle of claim 9 wherein upon said release mechanism releasing said at least one engaging wall, said at least one engaging wall applies a force against said insertion member inserted within said aperture.

12. An apparatus for performing general assembly of two or more microcomponents, said apparatus comprising:
   at least one pressure-fitting receptacle for receiving all or a portion of at least a first microcomponent to couple said apparatus to said at least a first microcomponent in a manner that constrains three degrees of translational freedom of said at least a first microcomponent relative to said apparatus without relying solely on frictional forces for constraining any one of said three degrees of translational freedom.

13. The apparatus of claim 12 wherein said apparatus has a size of approximately one hundred microns by one hundred microns.

14. The apparatus of claim 12 wherein said apparatus is capable of engaging said at least a first microcomponent in a manner that further constrains rotational freedom of said at least a first microcomponent relative to said apparatus.

15. The apparatus of claim 12 wherein said pressure fitting receptacle is implemented to receive an insertion member of said at least a first microcomponent.

16. The apparatus of claim 12 further comprising:
   at least one non-engaging aperture having inner sides against which a force may be applied for expanding said at least one pressure-fitting receptacle to enable insertion of said all or a portion of said at least a first microcomponent within said at least one pressure-fitting receptacle.

17. The apparatus of claim 12 wherein said pressure-fitting receptacle further comprises:
   at least one engaging wall that at least partially encloses an aperture and is movable relative to said aperture; and
   at least one latch mechanism for latching said at least one engaging wall of said pressure-fitting receptacle to a position for a desired coupling of said at least a first microcomponent.

18. The apparatus of claim 17 wherein said position for a desired coupling is a position that enables said all or a portion of said at least a first microcomponent to penetrate said pressure-fitting receptacle without contacting the edges of said pressure-fitting receptacle.

19. The apparatus of claim 17 wherein said position for a desired coupling is a position that enables said all or a portion of said at least a first microcomponent to penetrate said pressure-fitting receptacle with a minimal insertion force applied.

20. The apparatus of claim 19 wherein said insertion force is a near-zero insertion force.

21. The apparatus of claim 17 further comprising:
   at least one release mechanism for releasing said at least one engaging wall to enable said at least one engaging wall to clamp said all or a portion of said at least a first microcomponent to couple said pressure-fitting receptacle with said at least a first microcomponent.

22. The apparatus of claim 21 wherein said at least one release mechanism is arranged to release said at least one engaging wall as said all or a portion of said at least a first microcomponent is moved in-plane within said pressure-fitting receptacle to apply a force against said at least one release mechanism.

23. The pressure-fitting receptacle of claim 21 wherein upon said release mechanism releasing said at least one engaging wall, said at least one engaging wall applies a force against said all or a portion of said at least a first microcomponent inserted within said pressure-fitting receptacle.

24. A microcomponent comprising:
   a pressure-fitting receptacle for coupling with at least one other microcomponent in a manner that constrains at least three degrees of translational freedom of said at least one other microcomponent relative to said pressure-fitting receptacle, without relying solely on frictional forces for constraining any one of said at least three degrees of translational freedom.

25. The microcomponent of claim 24 wherein said microcomponent has a size no greater than approximately one centimeter by one centimeter.

26. The microcomponent of claim 24 wherein said pressure-fitting receptacle has a size no greater than approximately two hundred microns by two hundred microns.

27. The microcomponent of claim 24 wherein said pressure-fitting receptacle is a preloaded receptacle.

28. The microcomponent of claim 24 wherein said pressure-fitting receptacle is an expansion receptacle.

29. The microcomponent of claim 24 wherein said pressure-fitting receptacle is capable of engaging said at least one other microcomponent in a manner that further constrains rotational freedom of said at least one other microcomponent relative to said pressure-fitting receptacle.

30. The microcomponent of claim 24 wherein said pressure-fitting receptacle further comprises at least one aperture at least partially enclosed by at least one engaging wall, said at least one aperture for receiving at least a portion said at least one other microcomponent.

31. The microcomponent of claim 30 wherein said at least one engaging wall applies pressure against said at least a portion of said at least one other microcomponent inserted within said at least one aperture.

32. The microcomponent of claim 24 further comprising:
   at least one non-engaging aperture having inner sides against which a force may be applied for expanding said at least one pressure-fitting receptacle to enable insertion of at least a portion of said at least one other microcomponent within said at least one pressure-fitting receptacle.

33. The microcomponent of claim 24 wherein said pressure-fitting receptacle further comprises:
   at least one engaging wall that at least partially encloses an aperture and is movable relative to said aperture; and
   at least one latch mechanism for latching said at least one engaging wall of said pressure-fitting receptacle to a position for a desired coupling of said at least one other microcomponent.

34. The microcomponent of claim 33 wherein said position for a desired coupling is a position that enables at least a portion of said at least one other microcomponent to penetrate said pressure-fitting receptacle without contacting the edges of said pressure-fitting receptacle.

35. The microcomponent of claim 33 wherein said position for a desired coupling is a position that enables at least a portion of said at least one other microcomponent to penetrate said pressure-fitting receptacle with a minimal insertion force applied.

36. The microcomponent of claim 35 wherein said insertion force is a near-zero insertion force.

37. The microcomponent of claim 33 further comprising:
   at least one release mechanism for releasing said at least one engaging wall to enable said at least one engaging wall to clamp at least a portion of said at least one other microcomponent to couple said pressure-fitting receptacle with said at least one other microcomponent.

38. The microcomponent of claim 37 wherein said at least one release mechanism is arranged to release said at least one engaging wall as said at least a portion of said at least one other microcomponent is moved in-plane within said pressure-fitting receptacle to apply a force against said at least one release mechanism.

39. The microcomponent of claim 37 wherein upon said release mechanism releasing said at least one engaging wall, said at least one engaging wall applies a force against said at least a portion of said at least one other microcomponent inserted within said pressure-fitting receptacle.

40. An apparatus for coupling microcomponents, comprising:
   at least one pressure-fitting receptacle including at least one aperture that is at least partially enclosed by at least one movable engaging wall, wherein said at least one movable engaging wall is movable relative to said at least one aperture;
   at least one latch mechanism for latching said at least one engaging wall to a position for a desired coupling with at least a first microcomponent; and
   at least one release mechanism for releasing said at least one engaging wall operable after said at least one aperture is mated with said at least a first microcomponent.

41. The apparatus of claim 40 wherein said pressure-fitting receptacle has a size no greater than approximately two hundred microns by two hundred microns.

42. The apparatus of claim 40 wherein said position for a desired coupling is a position that enables an insertion member of said at least a first microcomponent to penetrate said at least one aperture of said at least one pressure-fitting receptacle without contacting the edges of said at least one aperture.

43. The apparatus of claim 40 wherein said position for a desired coupling is a position that enables an insertion member of said at least a first microcomponent to penetrate said at least one aperture of said at least one pressure-fitting receptacle with a minimal insertion force applied.

44. The apparatus of claim 40 wherein said apparatus is capable of engaging said at least a first microcomponent in a manner that constrains three degrees of translational freedom of said at least a first microcomponent relative to said apparatus.

45. The apparatus of claim 40 wherein said apparatus constrains rotational freedom of said at least a first microcomponent relative to said apparatus.

46. The apparatus of claim 40 wherein said at least one release mechanism is arranged to release said at least one engaging wall as said at least a first microcomponent is moved in-plane within said at least one aperture to apply a force against said at least one release mechanism.

47. The apparatus of claim 46 wherein upon said release mechanism releasing said at least one engaging wall, said at least one engaging wall applies a clamping force against at least a portion of said at least a first microcomponent inserted within said at least one aperture.

48. An apparatus for coupling and decoupling microcomponents, comprising:
   at least one pressure-fitting receptacle including at least one aperture at least partially enclosed by at least one engaging member for applying a clamping force against at least a portion of at least a first microcomponent inserted within said at least one aperture to enable said at least one pressure-fitting receptacle to be pressure fit with said at least a portion of said at least a first microcomponent to couple said apparatus with said at least a first microcomponent; and
   said at least one pressure-fitting receptacle further implemented to enable said at least one engaging member to be disengaged from said at least a portion of said at least a first microcomponent to decouple said apparatus from said at least a first microcomponent.

49. The apparatus of claim 48 wherein said pressure-fitting receptacle has a size of approximately one hundred microns by one hundred microns.

50. The apparatus of claim 48 wherein said apparatus engages said at least a first microcomponent in a manner that constrains three degrees of translational freedom of said at least a first microcomponent relative to said apparatus.

51. The apparatus of claim 48 wherein said apparatus engages said at least a first microcomponent in a manner that constrains rotational freedom of said at least a first microcomponent relative to said apparatus.

52. The apparatus of claim 48 wherein said apparatus comprises at least one spring biased to cause said at least one engaging member to apply said clamping force against said at least a portion of said at least a first microcomponent when said apparatus is coupled thereto to pressure fit said at least one pressure-fitting receptacle with said at least a portion of said at least a first microcomponent.

53. The apparatus of claim 49 wherein said apparatus constrains said three degrees of translational freedom of said at least a first microcomponent relative to said apparatus without relying solely on frictional forces for constraining any one of said three degrees of translational freedom.

54. The apparatus of claim 50 wherein said apparatus constrains said three degrees of translational freedom of said at least a first microcomponent relative to said apparatus without relying solely on frictional forces for constraining any one of said three degrees of translational freedom.

55. The apparatus of claim 48 wherein said clamping force comprises two substantially opposing forces applied against said at least a portion of said at least a first microcomponent.

56. The apparatus of claim 48 wherein said at least one engaging member comprises a plurality of engaging members applying said clamping force, and wherein said clamping force comprises at least two substantially opposing forces applied against said at least a portion of said at least a first microcomponent.

* * * * *